(12) United States Patent
Varma et al.

(10) Patent No.: US 12,028,075 B2
(45) Date of Patent: Jul. 2, 2024

(54) DATA DETECTION ON SERIAL COMMUNICATION LINKS

(71) Applicant: Apple Inc., Cupertino, CA (US)

(72) Inventors: Vishal Varma, Fremont, CA (US);
Dhaval H. Shah, Newark, CA (US);
Jose A. Tierno, Menlo Park, CA (US);
Sanjeev K. Maheshwari, Fremont, CA (US); Sumeet Gupta, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/823,952

(22) Filed: Aug. 31, 2022

(65) Prior Publication Data

US 2023/0387898 A1 Nov. 30, 2023

Related U.S. Application Data

(60) Provisional application No. 63/365,431, filed on May 27, 2022.

(51) Int. Cl.
*H03K 5/08* (2006.01)
*H04L 25/06* (2006.01)

(52) U.S. Cl.
CPC .......... *H03K 5/082* (2013.01); *H04L 25/062* (2013.01)

(58) Field of Classification Search
None
See application file for complete search history.

(56) References Cited

U.S. PATENT DOCUMENTS

| 5,237,590 A * | 8/1993 | Kazawa | H04L 7/0337 |
| | | | 714/707 |
| 5,825,825 A * | 10/1998 | Altmann | H04L 7/007 |
| | | | 375/293 |

(Continued)

FOREIGN PATENT DOCUMENTS

| CA | 2933452 A1 * | 7/2007 | ............ H03F 3/505 |
| EP | 3866424 A2 | 8/2021 | |

(Continued)

OTHER PUBLICATIONS

International Search Report and Written Opinion in PCT Appl. No. PCT/US2023/018961 dated Jul. 26, 2023, 9 pages.

*Primary Examiner* — Thomas J. Hiltunen
*Assistant Examiner* — Khareem E Almo
(74) *Attorney, Agent, or Firm* — Kowert, Hood, Munyon, Rankin & Goetzel, P.C.; Dean M. Munyon

(57) ABSTRACT

A serial data receiver subsystem included in a computer system may include a data detection circuit, a speed detection circuit, and a receiver circuit that includes multiple subcircuits. The data detection circuit performs a comparison of a reference voltage to the magnitude of signals received via a communication link that encodes a serial data stream consisting of multiple data symbols. Using a result of the comparison, the data detection circuit may activate a signal present indicator indicating the presence of data on the communication link. Once the signal present indicator is active, the speed detection circuit checks the number of transitions to determine a rate at which data is being transmitted. In response to a determination that the rate of the data being transmitted exceeds a threshold value, the receiver circuit activates one or more of the multiple subcircuits.

20 Claims, 10 Drawing Sheets

(56) References Cited

U.S. PATENT DOCUMENTS

| | | | |
|---|---|---|---|
| 6,229,845 | B1 | 5/2001 | Chan |
| 7,342,521 | B1 | 3/2008 | Liu |
| 7,477,704 | B1 * | 1/2009 | Cornelius ........... G06F 13/4072 |
| | | | 330/252 |
| 7,805,083 | B2 | 9/2010 | Gu et al. |
| 9,608,800 | B2 * | 3/2017 | Shi ........................... H04L 7/02 |
| 10,003,345 | B2 * | 6/2018 | Lee ......................... H03L 7/113 |
| 11,133,920 | B2 * | 9/2021 | Lim ....................... H03L 7/0891 |
| 11,271,571 | B2 * | 3/2022 | Tajalli ................... H03L 7/0995 |
| 2003/0001627 | A1 | 1/2003 | Simoni |
| 2003/0094975 | A1 * | 5/2003 | Noguchi ................. H03K 5/086 |
| | | | 327/31 |
| 2009/0058477 | A1 * | 3/2009 | Curtis ................. H03K 5/1252 |
| | | | 327/145 |
| 2020/0219522 | A1 | 7/2020 | Lesso et al. |

FOREIGN PATENT DOCUMENTS

| | | |
|---|---|---|
| JP | 2000-286922 A | 10/2000 |
| KR | 10-2271075 B1 | 7/2021 |

\* cited by examiner

DATA DETECTION ON SERIAL COMMUNICATION LINKS

PRIORITY INFORMATION

This application claims the benefit of U.S. Provisional Application No. 63/365,431 entitled "Data Detection on Serial Communication Links", filed on May 27, 2022, which is incorporated by reference herein in its entirety.

BACKGROUND

Technical Field

This disclosure relates to the field of high-speed communication interface design and, in particular, to detecting the presence of data on a serial communication link

Description of the Related Art

Computing systems typically include a number of interconnected integrated circuits. In some cases, the integrated circuits may communicate using communication channels or links to transmit and receive data bits. The communication channels may support parallel communication, in which multiple data bits are transmitted in parallel, or serial communication, in which data bits are transmitted one bit at a time in a serial fashion.

The data transmitted between integrated circuits may be encoded to aid in transmission. For example, in the case of serial communication, data may be encoded to provide sufficient transitions between logic states to allow for clock and data recovery circuits to operate. Alternatively, in the case of parallel communication, the data may be encoded to reduce switching noise or to improve signal integrity.

During transmission of the data, the physical characteristics of the communication channel may attenuate a transmitted signal associated with a particular data bit. For example, the impedance of wiring included in the communication channel or link may attenuate certain frequency ranges of the transmitted signal. Additionally, impedance mismatches between wiring included in the communication channel, and devices coupled to the communication channel, may induce reflections of the transmitted signal, which may degrade subsequently transmitted signals corresponding to other data bits.

Figure 1:
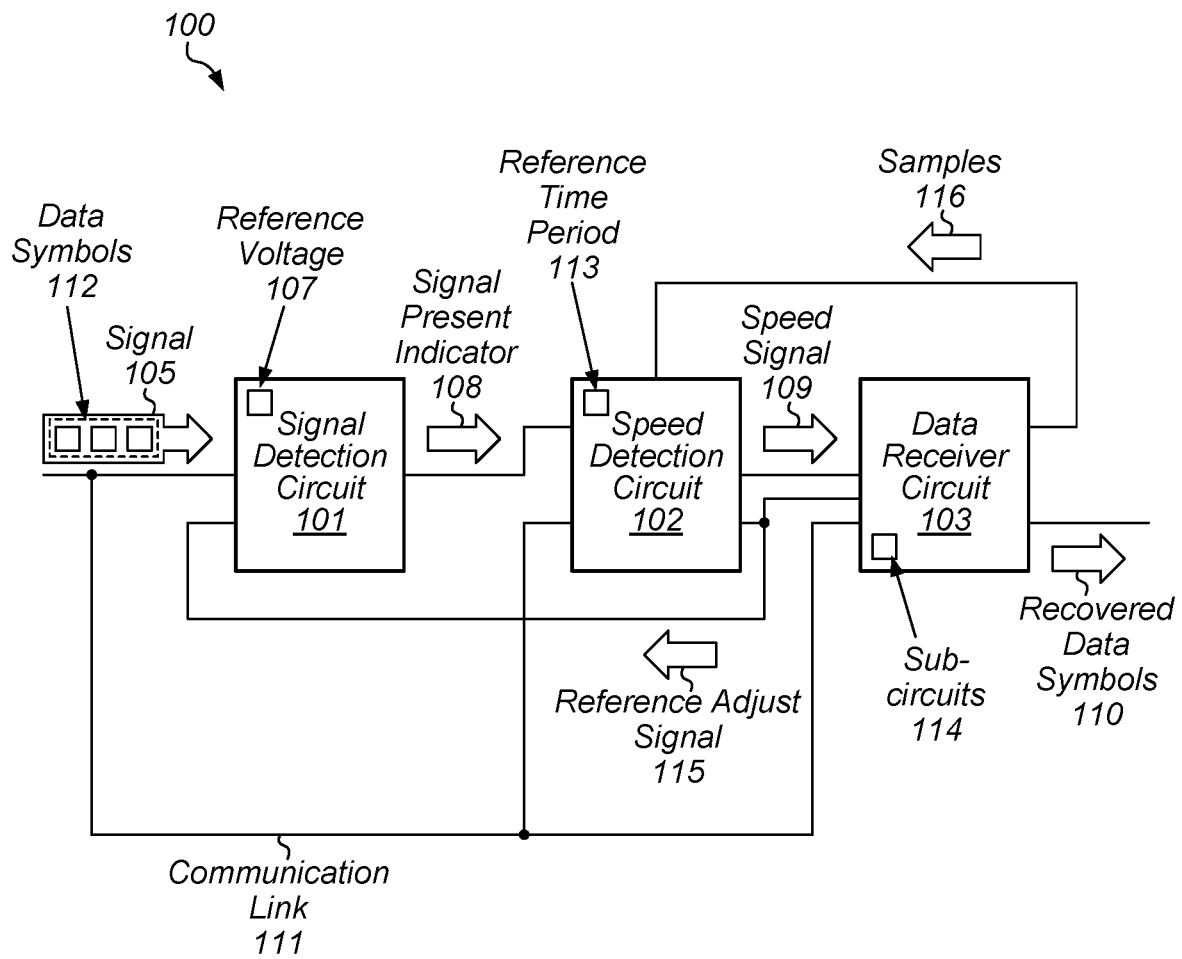
FIG. 1 is a block diagram of an embodiment of a receiver circuit for a serial communication link in a computer system.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims.

DETAILED DESCRIPTION OF EMBODIMENTS

A computing system may include one or more integrated circuits, such as, e.g., a central processing unit (CPU) and memories. Various integrated circuits of the computing system may communicate through either a serial or parallel interface. In a parallel interface, multiple data bits are communicated simultaneously, while in a serial interface, data is communicated as a series of sequential single data bits. When employing a serial interface to communicate data between two devices included in a computing system, the data may be transmitted according to different protocols. For example, the data may be transmitted using a return to zero (RZ) protocol, non-return to zero (NRZ) protocol, pulse amplitude modulation (PAM), or any suitable combination thereof.

Serial data streams are often transmitted without an accompanying clock signal. In such cases, a clock signal is recovered from the serial data stream (in a process referred to as "clock recovery") and used for sampling the serial data stream to determine the values of the included data symbols. Various techniques can be employed to recover a clock signal. For example, a receiver circuit may generate a clock signal whose frequency is approximately the same as that of a clock signal used to create the data stream. A phase-locked loop circuit may then be used to phase align the clock signal with transitions in the serial data stream. Alternatively, the serial data stream may be oversampled, i.e., sampled at a higher frequency than that of the clock signal used generate the serial data stream.

In some computer systems, a communication link can operate in different modes. For example, some communication links have an idle mode, a low-speed periodic signaling mode in addition to a high-speed data mode. Depending on the operation of the computer system, the communication link may switch between the different modes. For example, in response to activation of a sleep or power-down mode for the computer system, the communication link may be placed in an idle mode during which no data is transmitted.

Receiver circuits coupled to a communication link must monitor the communication in order to determine the state of communication link. Different circuits within a receiver circuit may be used for the different modes of the communication link. Circuits used for a particular mode may be disabled when that mode is not in use and must be re-enabled when the particular mode is detected on the communication link. Failing to detect a change in the mode of the communication link can result in loss of transmitted data. For example, circuits within the receiver circuit suitable for used with the low-speed mode are not adequate to properly sample and recover data transmitted in the high-speed mode.

The embodiments illustrated in the drawings and described below provide techniques for monitoring the mode of a communication link. Such monitoring includes detecting transmitted data on the communication link and determining whether the data being transmitted is high-speed data. By detecting the presence of high-speed data on the serial link, portions of a receiver circuit can be powered-up to prevent loss of data, which would require re-transmission, thus contributing to adding latency in resuming communication on the serial communication link.

A block diagram depicting an embodiment of a receiver subsystem is illustrated in FIG. 1. As illustrated, receiver subsystem 100 includes signal detection circuit 101, speed detection circuit 102, and data receiver circuit 103.

Signal detection circuit 101 is configured to perform a comparison of a magnitude of signal 105 to reference voltage 107. In various embodiments, signal 105 is transmitted via communication link 111 and encodes a serial data stream that includes data symbols 112. Signal detection circuit 101 is also configured to activate signal present indicator 108 using a result of the comparison. As described below, signal detection circuit 101 can be configured to adjust a value of reference voltage 107 using reference adjust signal 115.

Speed detection circuit 102 is configured, in response to an activation of signal present indicator 108, to generate speed signal 109 based on a number of transitions in signal 105 over a reference time period 113. In some embodiments, speed detection circuit 102 may employ samples 116 generated by data receiver circuit 103 to determine the number of transitions in signal 105. As described below, a duration of reference time period 113 may be adjusted based on electrical characteristics of communication link 111 as well as receiver subsystem 100. In various embodiments, an activation of speed signal 109 may correspond to a detection of data rate of data symbols 106 that exceeds a threshold value. In various embodiments, speed detection circuit 102 is also configured to generate reference adjust signal 115 based on a magnitude of signal 105.

As used herein, when a signal is activated, it is set to a logic or voltage level that activates a load circuit or device. The logic level may be either a high logic level or a low logic level depending on the load circuit. For example, an active state of a signal coupled to a p-channel metal-oxide semiconductor field-effect transistor (MOSFET), Fin field-effect transistor (FinFET), or gate-all-around field-effect transistor (GAAFET) is a low logic level (referred to as an "active low signal"), while an active state of a signal coupled to an n-channel MOSFET, FinFET, or GAAFET is a high logic level (referred to as an "active high signal").

Data receiver circuit 103 includes sub-circuit 114 and is configured to activate one or more of subcircuits 114 in response to an activation of speed signal 109. As described below, subcircuits 114 may include filter circuits, equalization circuits, data and clock recovery circuits, and the like. Additionally, data receiver circuit 103 is configured to sample signal 105 to generate samples 116. In various embodiments, data receiver circuit 103 is further configured to process samples 116 to generate recovered data symbols 110. It is noted that, in some embodiments, data receiver circuit 103 may be configured to adjust a sampling threshold value based on reference adjust signal 115.

Figure 2:
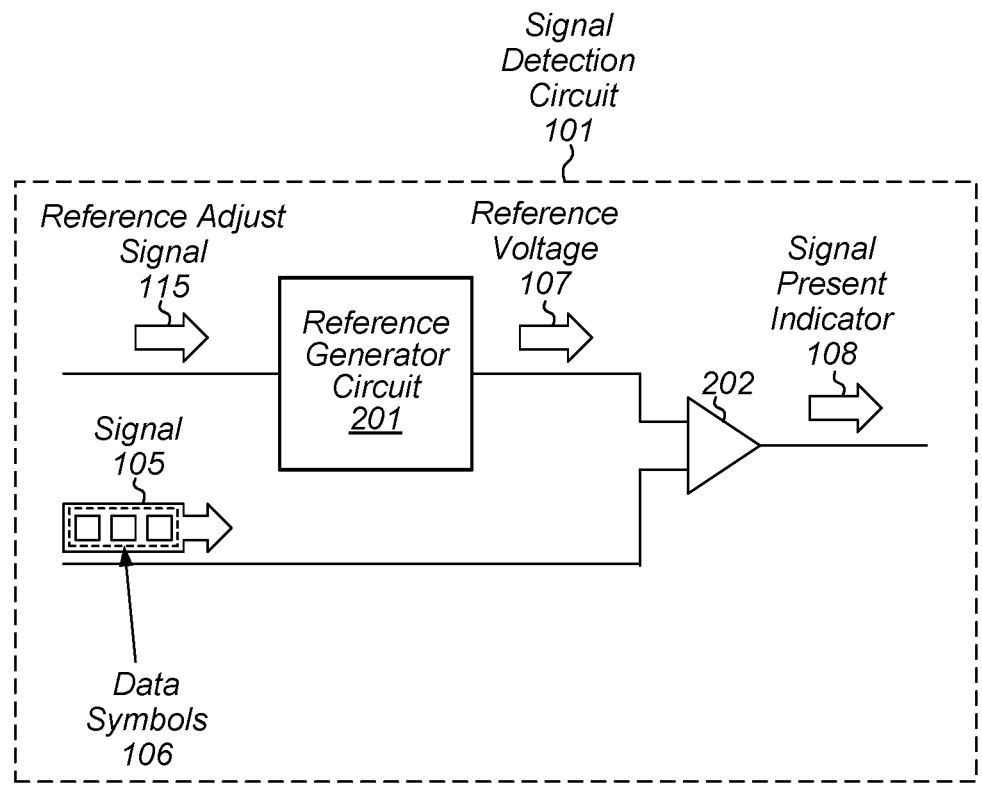
FIG. 2 is a block diagram an embodiment of a data detection circuit.

Turning to FIG. 2, a block diagram of an embodiment of signal detection circuit 101 is depicted. As illustrated, signal detection circuit 101 includes reference generator circuit 201 and comparator circuit 202.

Reference generator circuit 201 is configured to generate reference voltage 107. In various embodiments, reference generator circuit 201 may be further configured to adapt or change the value of reference voltage 107 using reference adjust signal 115. In some cases, reference generator circuit 201 may be configured to increase the value of reference voltage 107 in response to a determination that a magnitude of signal 105 has exceed an initial value for reference voltage 107. In some embodiments, reference generator circuit 201 may be also configured to reset the value of reference voltage 107 to the initial value in response to a determination that a communication link or bus through which signals 105 propagate has entered and idle or sleep state. It is noted that, in some embodiments, the initial value of reference voltage 107 as well as the adapted value of reference voltage 107 may be programmable.

Reference generator circuit 201 may be implemented using a band gap reference circuit, a voltage scaling circuit, or any other circuits suitable for generating a reference voltage value. In some cases, reference generator circuit 201 may be configured to generate reference voltage 107 to be independent of temperature and/or power supply voltage level.

Comparator circuit 202 is configured to generate signal present indicator 108 using signal 105 and reference voltage 107. In various embodiments, comparator circuit 202 may be configured to compare a voltage level of signal 105 to reference voltage 107, and generate signal present indicator 108 using a result of the comparison. It is noted that although comparator circuit 202 is depicted as comparing two signals, in other embodiments, additional comparators may be employed in cases where data symbols 106 are transmitted to receiver subsystem 100 using multiple signals.

In various embodiments, comparator circuit 202 may be implemented using a differential amplifier circuit or any other circuit suitable for comparing respective voltage levels of two or more signals. In cases where signal present indicator 108 is a digital signal, comparator circuit 202 may be implemented using a Schmitt trigger circuit or other suitable circuit.

Figure 3:
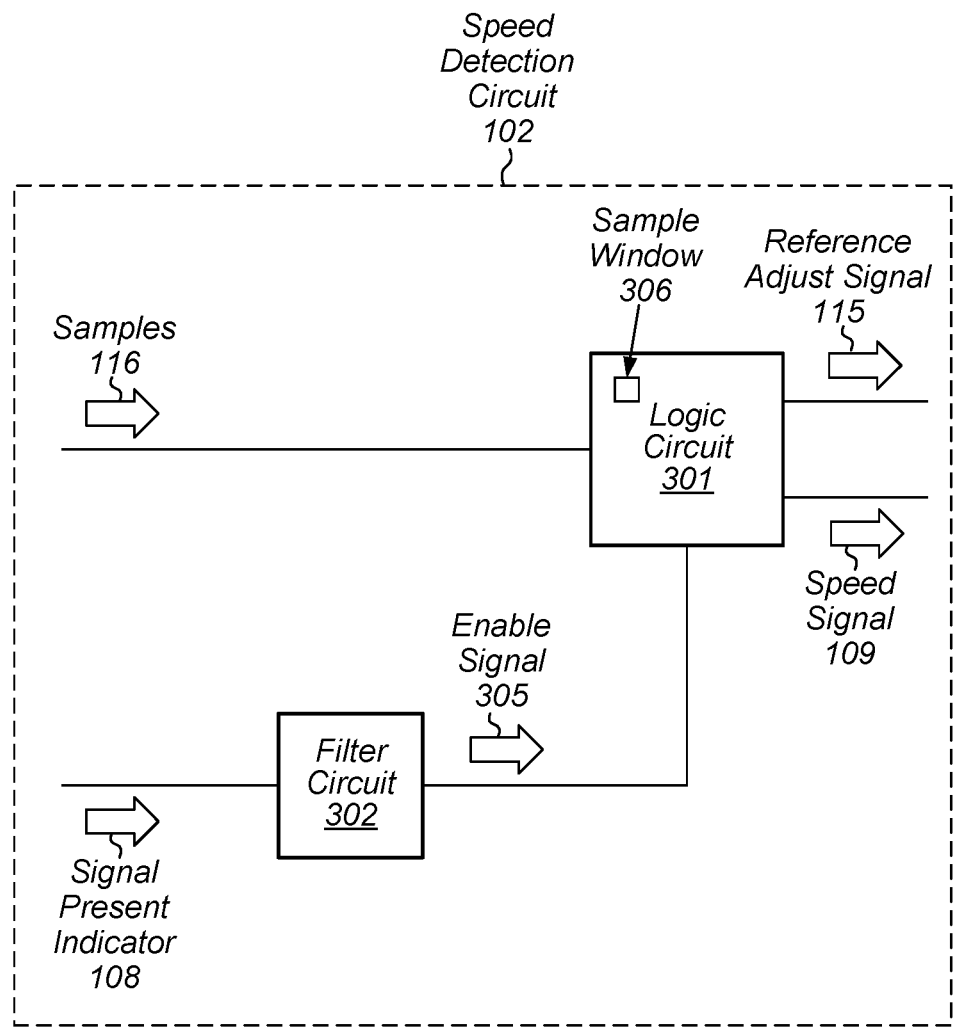
FIG. 3 is a block diagram of an embodiment of speed detection circuit.

A block diagram of speed detection circuit 102 is depicted in FIG. 3. As illustrated, speed detection circuit 102 includes logic circuit 301 and filter circuit 302.

Logic circuit 301 is configured to generate speed signal 109 and reference adjust signal 115 using samples 116. In various embodiments, to generate speed signal 109, logic circuit 301 is configured, in response to an activation of enable signal 305, to determine a number of samples detected in samples 116 during sample window 306. In various embodiments, a width of sample window 306 may correspond to reference time period 113. Logic circuit 301 is also configured to activate speed signal 109 in response to a determination that the number of samples in samples 116 during sample window 306 is greater than a threshold value. In response to a deactivation of enable signal 305, logic circuit 301 is further configured to hold speed signal 109 in a deactivated or inactive state.

In various embodiments, logic circuit 301 may be configured to change a value of reference adjust signal 115 based on one or more values of sampled signal 304. In some cases, in response to a detection of an increase in the number of samples 116 measured over consecutive ones of sample window 306, logic circuit 301 may be configured to increase the value of reference adjust signal 115. In various embodiments, reference adjust signal 115 may be a digital signal that includes multiple bit that encode information indicative of desired value for reference voltage 107. Alternatively, reference adjust signal 115 may be an analog signal that is used by reference generator circuit 201 to adjust the value of reference voltage 107.

Logic circuit 301 may be implemented using a microcontroller, state machine, or any other suitable combination of sequential and combinatorial logic circuits. In some embodiments, logic circuit 301 may be configured to receive information indicative of operational characteristics of a computer system that includes receiver subsystem circuit 100, and adjust a duration of sample window 306 based on the received information. Such information may, in various embodiments, include temperature, noise levels on communication link 111, power supply voltage levels, etc. Alternatively, logic circuit 301 may include one or more register circuits that can be programmed with different values for sample window 306.

As the magnitude of signal 105 nears reference voltage 107, the output of comparator circuit 202 may toggle between high and low logic levels due to tolerances in circuit elements in comparator circuit 202 as well as variation in reference voltage 107 due to power supply noise and the like. As a result, there may be a range of the voltage level of signal 105 during which the value of signal present indicator 108 may be changing. To remediate this problem, a filter is employed.

Filter circuit 302 is configured to generate enable signal 305 using signal present indicator 108. In various embodiments, filter circuit 302 may be configured to perform a digital filter operation on signal present indicator 108 to generate enable signal 305. The digital filter operation may include performing a multi-term average operation. In some embodiments, filter circuit 302 may be programmable to account for changes in operational characteristics of a computer system that includes receiver subsystem 100. Filter circuit 302 may, in various embodiments, be implemented using a state machine or any other suitable combination of sequential and combinatorial logic circuits.

Figure 4:
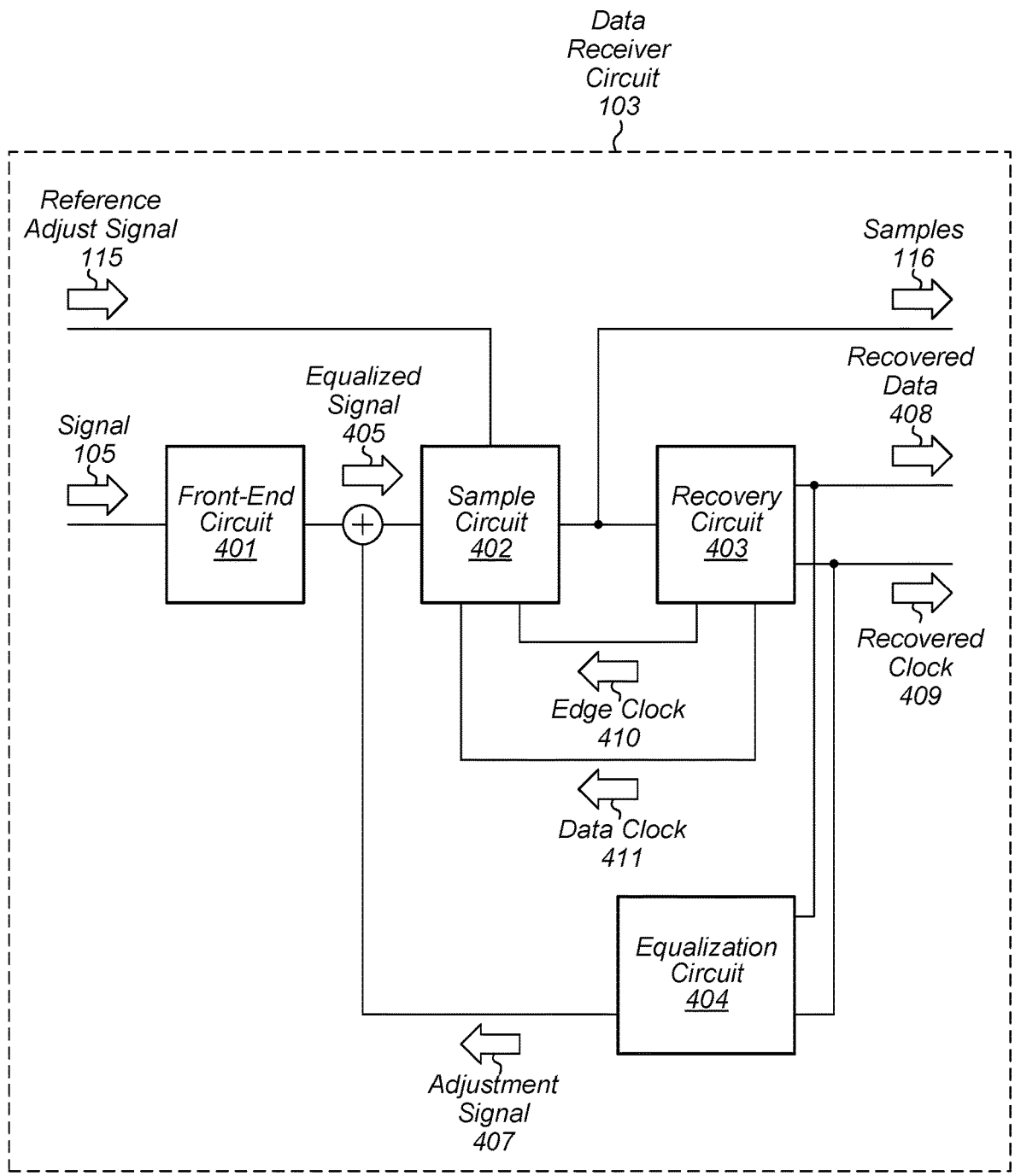
FIG. 4 is a block diagram of an embodiment of a receiver circuit.

Turning to FIG. 4, a block diagram of data receiver circuit 103 is depicted. As illustrated, data receiver circuit 103 includes front-end circuit 401, sample circuit 402, recovery circuit 403, and equalization circuit 404. In various embodiments, one or more of front-end circuit 401, sample circuit 402, recovery circuit 403, and equalization circuit 404 may be included in subcircuits 114.

Front-end circuit 401 is configured to generate equalized signal 405 using signal 105. In various embodiments, front-end circuit 401 may be implemented using filter circuits and automatic gain control circuits. Front-end circuit 401 may, in some embodiments, employ continuous-time linear equalization techniques while, in other embodiments, front-end circuit 401 may employ any suitable equalization techniques.

Sample circuit 402 is configured to generate samples 116 using a combination of equalized signal 405 and adjustment signal 407 and edge clock 410 and data clock 411. In various embodiments, sample circuit 402 may employ multiple slicer circuits configured to compare the combination of equalized signal 405 and adjustment signal 407 to respective threshold values to generate samples 116. In some cases, sample circuit 402 is also configured to adjust the threshold values based on reference adjust signal 115. In some embodiments, reference adjust signal 115 may actuate one or more analog switches to select different threshold values from multiple threshold values. Alternatively, reference adjust signal 115 may adjust bias voltages and/or currents within a reference generator circuit to change the threshold values.

In other embodiments, sample circuit 402 may include one or more analog-to-digital converter circuits configured to generate multiple bits whose value encodes the magnitude of the combination of equalized signal 405 and adjustment signal 407 at a particular point in time. The times at which the analog-to-digital converter circuits outputs are captured may, in various embodiments, be controlled by edge clock 410 and data clock 411.

In various embodiments, edge clock 411 and data clock 411 are synchronized to transitions in signal 105 that correspond to changes in data symbols 112. Sample circuit 402 is configured to sample the combination of equalized signal 405 and adjustment signal 407 near a transition using rising and falling edges of edge clock 410. In a similar fashion, sample circuit 402 is configured to sample the combination of equalized signal 405 and adjustment signal 407 between transitions using data clock 411.

Recovery circuit 403 is configured to generate, using samples 116, recovered data 408 recovered clock 409, edge clock 410, and data clock 411. In various embodiments, recovery circuit 403 may perform various operations (e.g., feed forward equalization) to generate recovered data 408. In some cases, recovery circuit 403 may operate on multiple symbols in parallel. In such cases, recovery circuit 403 may wait until a particular number of samples have been received from samples 406 been received before performing certain ones of various clock and data recovery operations. In some embodiments, recovery circuit 403 may include phase-locked loop circuits, delay-locked loop circuits, or any other suitable circuits to generate edge clock 410 such that it is aligned with transitions in the combination of equalized signal 405 and adjustment signal 407. Recovery circuit 403 may employ similar circuits to generate data clock 411 with a known phase difference (e.g., 90-degrees) relative to edge clock 410.

Equalization circuit 404 is configured to generate adjustment signal 407 using recovered data 408 and recovered clock 409. In various embodiments, equalization circuit 404 may be implemented using a decision feedback equalization (DFE) circuit configured to use multiple symbols included in recovered data 408 to scale analog voltage levels to generate adjustment signal 407 in order to cancel inter-symbol interference (ISI) that occurs as signal 105 is transmitted on communication link 111.

Figure 5:
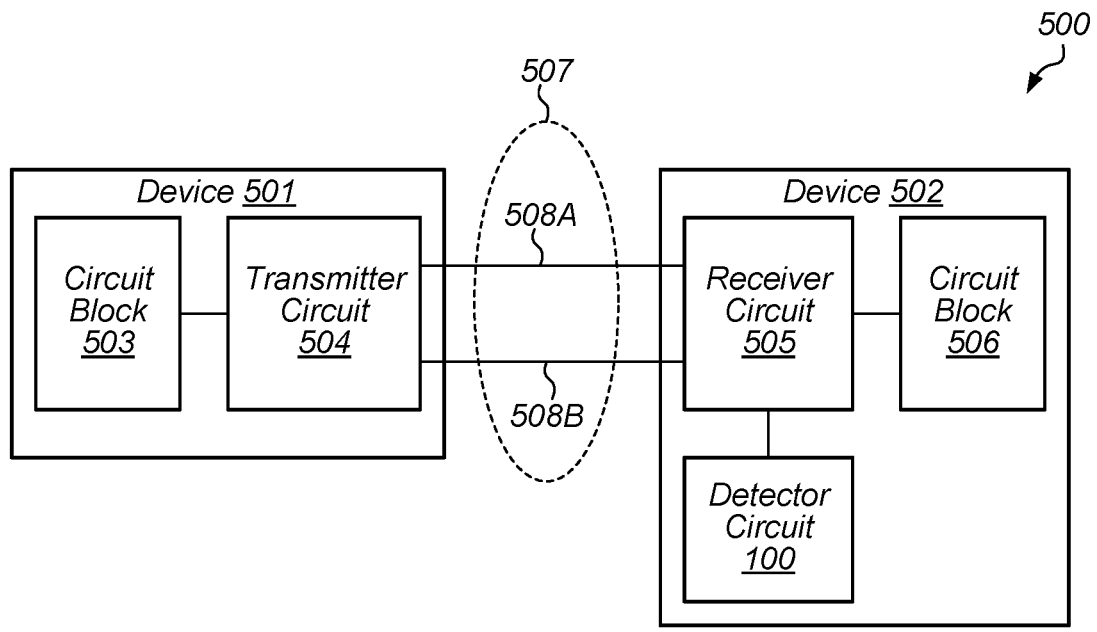
FIG. 5 is a block diagram of a computer system that includes a transmitter circuit and a receiver circuit.

As described above, a detector circuit, such as receiver subsystem 100, may be used in a computer system with a communication link. A block diagram of an embodiment of such a computer system is depicted in FIG. 5. As illustrated, computer system 500 includes devices 501 and 502, coupled by communication bus 507.

Device 501 includes circuit block 503 and transmitter circuit 504. In various embodiments, device 501 may be a processor circuit, a processor core, a memory circuit, or any other suitable circuit block that may be included on an integrated circuit in a computer system. It is noted that although device 501 only depicts a single circuit block and a single transmitter circuit, in other embodiments, additional circuit blocks and additional transmitter circuits may be employed.

Transmitter circuit 504 is configured to serially transmit signals, via communication bus 507, corresponding to data received from circuit block 503. Such signals may differentially encode one or more bits such that a difference between the respective voltage levels of wires 508A and 508B, at a particular point in time, correspond to a particular bit value. In some cases, the generation of the signals may include encoding the bits prior to transmission. It is noted that although communication bus 507 is depicted as including two wires, in other embodiments, any suitable number of wires may be employed. In some cases, transmitter circuit 504 may be further configured to generate the transmit signals according to one of various communication protocols, such as the USB protocol.

Device 502 includes signal detection circuit 101, receiver circuit 505, and circuit block 506. Like device 501, device 502 may be a processor circuit, a processor core, a memory circuit, or any other suitable circuit block configured to receive data from transmitter circuit 504. In various embodiments, receiver circuit 505 may be configured to place certain subcircuits within receiver circuit 505 into a sleep or power-down state when communication bus 507 is idle. As described above, signal detection circuit 101 is configured to generate an enable signal when data transfer is resumed on communication bus 507. The enable signal is used by receiver circuit 505 to re-activate any circuits block that had been previous placed into the sleep or power-down state.

Devices 501 and 502 may, in some embodiments, be fabricated on a common integrated circuit. In other embodiments, devices 501 and 502 may be located on different integrated circuits mounted on a common substrate or circuit board. In such cases, communication bus 507 may include metal or other conductive traces on the substrate or circuit board. Although only two devices are depicted in computer system 500, in other embodiments, any suitable number of devices may be employed.

Figure 6:
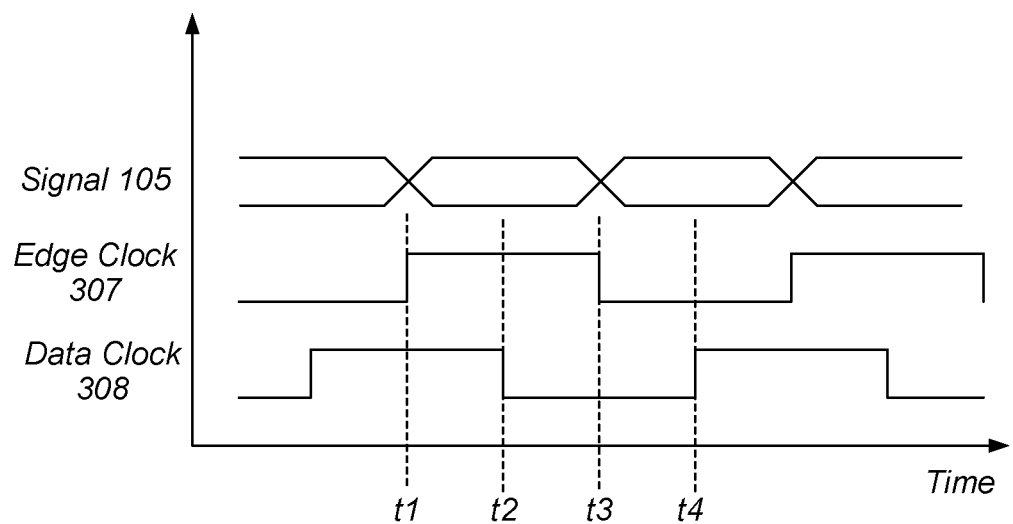
FIG. 6 is a diagram depicting sampling a signal used in a serial communication link to determine transitions.

Turning to FIG. 6, waveforms depicting sampling a signal used in a serial communication link to determine transitions are illustrated. It is noted that the waveforms are examples and that in order embodiments, the relative timings of the waveforms may be different. In various embodiments, edge clock 307 may be out of phase from data clock 308 by 90 degrees.

As noted above, once signal detection circuit 101 determines the presence of data on communication link 111, edge clock 307 and data clock 308 may be aligned using transitions in the signal 105. Edge clock 307 and data clock 308 may be aligned using a clock recovery circuit or any other suitable method for aligning clocks to transitions in signal 105.

At time t1, a rising edge of edge clock 307 is used to sample signal 105. At time t2, a falling edge of edge clock 307 is used to sample signal 105. In various embodiments, the sample from time t1 is compare to the sample from t3. In response to a determination that the two samples have different values, sample circuit 301 is configured to detect a transition in signal 105 that occurred between times t1 and t3.

At time t2, a falling edge of data clock 308 is used to sample signal 105, and, at time t4, a rising edge of data clock 308 is used to sample signal 105. In various embodiments, sample circuit 301 is configured to compare the sample taken at time t2 with the sample taken at time t4. Since data clock 308 should be sampling signal 105 during a period of valid data, the two samples can be used to determine if a transition has occurred. In some cases, such information may be relayed to a clock recovery circuit to adjust the timing of data clock 308.

In some embodiments, sample circuit 301 may be configured to compare the sample taken at time t2 to the sample taken at time t3. If the two samples do not have the same value, sample circuit 301 is configured to indicate a transition. By using both the rising and falling edges of edge clock 307 and data clock 308, the granularity with which sample circuit 301 samples signal 105 can be quite fine. In cases where transitions are detected in unexpected locations, e.g., between times t3 and t4, the timing of edge clock 307 and data clock 308 may be adjusted. In a similar fashion, if no transition is detected where one is expected, e.g., between times t1 and t2, the timing of edge clock 307 and data clock 308 may be further adjusted.

It is noted that the comparison of samples described above is only an example. In other embodiments, the samples taken at the rising and falling edges of edge clock 307 and data clock 308 may be compared according to any suitable algorithm.

To summarize, various embodiments of serial data receiver circuit that includes a detector circuit are disclosed. Broadly speaking, an apparatus is contemplated in which a signal detection circuit is configured to perform a first comparison of a magnitude of at least one signal to a reference voltage. In various embodiments, the at least one signal encodes a serial data stream that includes a plurality of data symbols. The signal detection circuit is also configured to activate a signal present indicator using a result of the comparison. A speed detection circuit configured, in response to an activation of the signal present indicator, or active signal, to generate an enable signal based on a number of transitions in the serial data stream over a reference period of time. A receiver circuit, that includes a plurality of subcircuits, is configured to activate one or more of the plurality of subcircuits in response to an activation of the enable signal.

In other embodiments, to generate the enable signal, the speed detection circuit is further configured to sample the at least one signal to generate a plurality of samples and determine a number of transitions in the serial data stream over a reference period of time using the plurality of samples. The speed detection circuit may be further configured to perform a second comparison of the number of transitions to a threshold value, and activate the enable signal using a result of the second comparison.

In some embodiments, the speed detection circuit is further configured to filter the signal present indicator, or active signal, to generate a filtered active signal, and sample, in response to a determination that the filtered active signal has a particular value, the at least one signal to generate the plurality of samples. In a different embodiment, the speed detection circuit is further configured to adjust a value of the reference period of time using one or more operational characteristics of a computer system that includes the receiver circuit.

In various embodiments, to sample the at least one signal, the speed detection circuit is further configured to sample the at least one signal using a first edge of a clock signal to generate a first sample, and sample the at least one signal using a second edge of the clock signal to generate a second sample. In such cases, to perform the second comparison, the speed detection circuit is further configured to compare the first sample to the second sample. In other embodiments, the data detection circuit is further configured to set the reference voltage to an initial value, and modify a value of the reference voltage in response to a determination that the magnitude of the at least one signal exceeds the initial value of the reference voltage.

Figure 7:
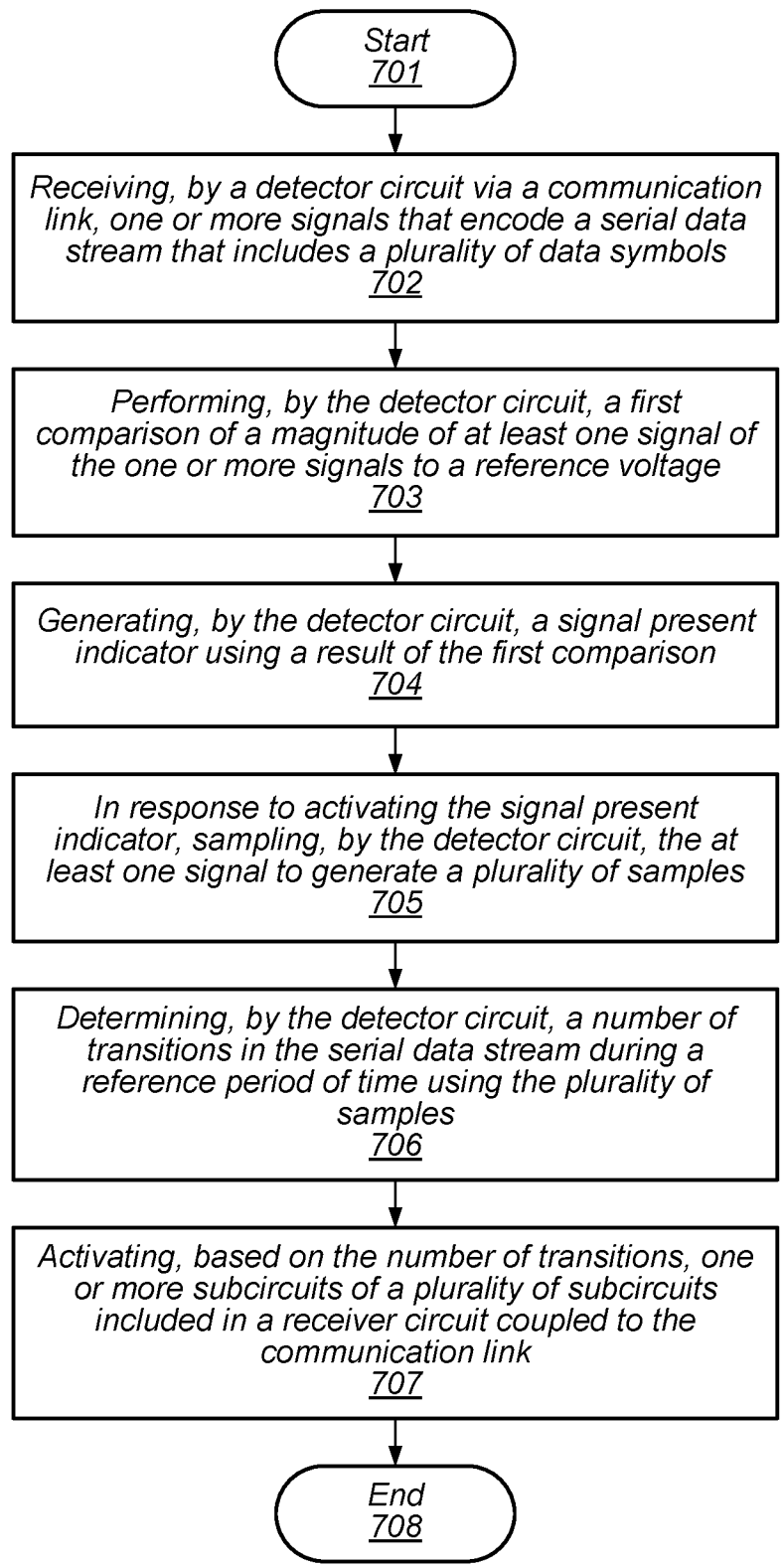
FIG. 7 is a flow diagram of an embodiment of a method for detecting data on a serial link.

Turning to FIG. 7, a flow diagram depicting an embodiment of a method for detecting data on a communication link is illustrated. The method, which may be applied to various receiver subsystems, such as receiver subsystem 100 as depicted in FIG. 1, begins in block 701.

The method includes receiving, by a detector circuit via a communication link, one or more signals that encode a serial data stream that includes a plurality of data symbols (block 702). In various embodiments, the serial data stream may be encoded to one of various communication protocols, such as the USB protocol.

The method further includes performing, by the detector circuit, a first comparison of a magnitude of at least one signal of the plurality of signals to a reference voltage (block 703). In various embodiments, the method may also include setting the reference voltage to an initial value and modifying a value of the reference voltage in response to determining the magnitude of the at least one signal exceeds the initial value of the reference voltage.

The method also includes generating, by the detector circuit, a signal present indicator using a result of the first comparison (block 704). In some embodiments, the generating may include generating a digital value based on the result of the first comparison.

The method further includes, in response to activating the signal present indicator, sampling, by the detector circuit, the at least one signal to generate a plurality of samples (block 705). In some embodiments, the method also includes filtering, by the detector circuit, the to generate a filtered active signal, and sampling, by the detector circuit in response to determining that the filtered active signal has a particular value, the at least one signal to generate the plurality of samples. In various embodiments, the method may also include sampling the at least one signal using one or more threshold values and adjusting one or more threshold values in response to determining the magnitude of the at least one signal exceeds the initial value of the reference voltage.

In other embodiments, sampling the at least one signal includes sampling the at least one signal using a first edge of a clock signal to generate a first sample and sampling the at least one signal using a second edge of the clock signal to generate a second sample. The method may also include determining the number of transitions includes comparing the first sample to the second sample. It is noted that although the method describes the use of a single clock signal, in other embodiments, different clocks signals (e.g., an edge clock signal and a data clock signal) may be used to sample the at least one signal, and the different samples from the different clock signals may be compared to determine the number of transitions.

The method also includes determining, by the detector circuit, a number of transitions in the serial data stream during a reference period of time using the plurality of samples (block 706). In some embodiments, the method may further include determining a value of the reference period using one or more operational characteristics of a computer system that includes the detector circuit. The one or more operational characteristics may, in different embodiments, include a noise level of the communication link, temperature of the computer system, a voltage level of a power supply node coupled to the detector circuit, or any other suitable operational characteristic of the computer system.

The method further includes activating, based on the number of transitions, one or more subcircuits of a plurality of subcircuits included in a receiver circuit coupled to the communication link (block 707). In various embodiments, activating the one or more subcircuits may include performing a second comparison of the number of transitions to a threshold value, and generating an enable signal using a result of the second comparison. The method may further include activating the one or more subcircuits in response to activating the enable signal.

In other embodiments, the method may include recovering, by the receiver circuit in response to activating the one or more subcircuit, one of more of the plurality of data symbols from the one or more signals. The method concludes in block 708.

Figure 8:
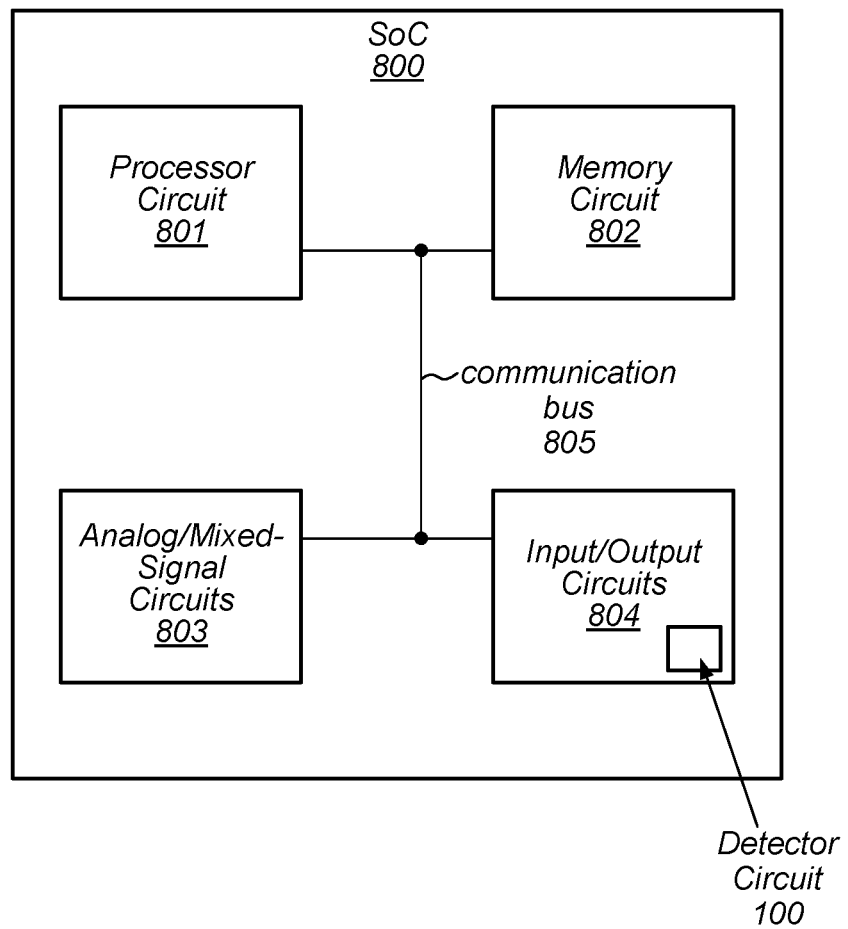
FIG. 8 is a block diagram of one embodiment of a system-on-a-chip that includes a detector circuit.

A block diagram of a system-on-a-chip (SoC) is illustrated in FIG. 8. In the illustrated embodiment, SoC 800 includes processor circuit 801, memory circuit 802, analog/mixed-signal circuits 803, and input/output circuits 804, each of which is coupled to communication bus 805. In various embodiments, SoC 800 may be configured for use in a desktop computer, server, or in a mobile computing application such as, e.g., a tablet, laptop computer, or wearable computing device.

Processor circuit 801 may, in various embodiments, be representative of a general-purpose processor that performs computational operations. For example, processor circuit 801 may be a central processing unit (CPU) such as a microprocessor, a microcontroller, an application-specific integrated circuit (ASIC), or a field-programmable gate array (FPGA).

Memory circuit 802 may in various embodiments, include any suitable type of memory such as a Dynamic Random-Access Memory (DRAM), a Static Random-Access Memory (SRAM), a Read-Only Memory (ROM), an Electrically Erasable Programmable Read-only Memory (EEPROM), or a non-volatile memory, for example. It is noted that although a single memory circuit is illustrated in FIG. 8, in other embodiments, any suitable number of memory circuits may be employed.

Analog/mixed-signal circuits 803 may include a crystal oscillator circuit, a phase-locked loop (PLL) circuit, an analog-to-digital converter (ADC) circuit, and a digital-to-analog converter (DAC) circuit (all not shown). In other embodiments, analog/mixed-signal circuits 803 may be configured to perform power management tasks with the inclusion of on-chip power supplies and voltage regulators.

Input/output circuits 804 may be configured to coordinate data transfer between SoC 800 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 804 may be configured to implement a version of Universal Serial Bus (USB) protocol or IEEE 1394 (Firewire®) protocol, and include receiver subsystem 100 as depicted in the embodiment of FIG. 1.

Input/output circuits 804 may also be configured to coordinate data transfer between SoC 800 and one or more devices (e.g., other computing systems or integrated circuits) coupled to SoC 800 via a network. In one embodiment, input/output circuits 804 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 804 may be configured to implement multiple discrete network interface ports.

Figure 9:
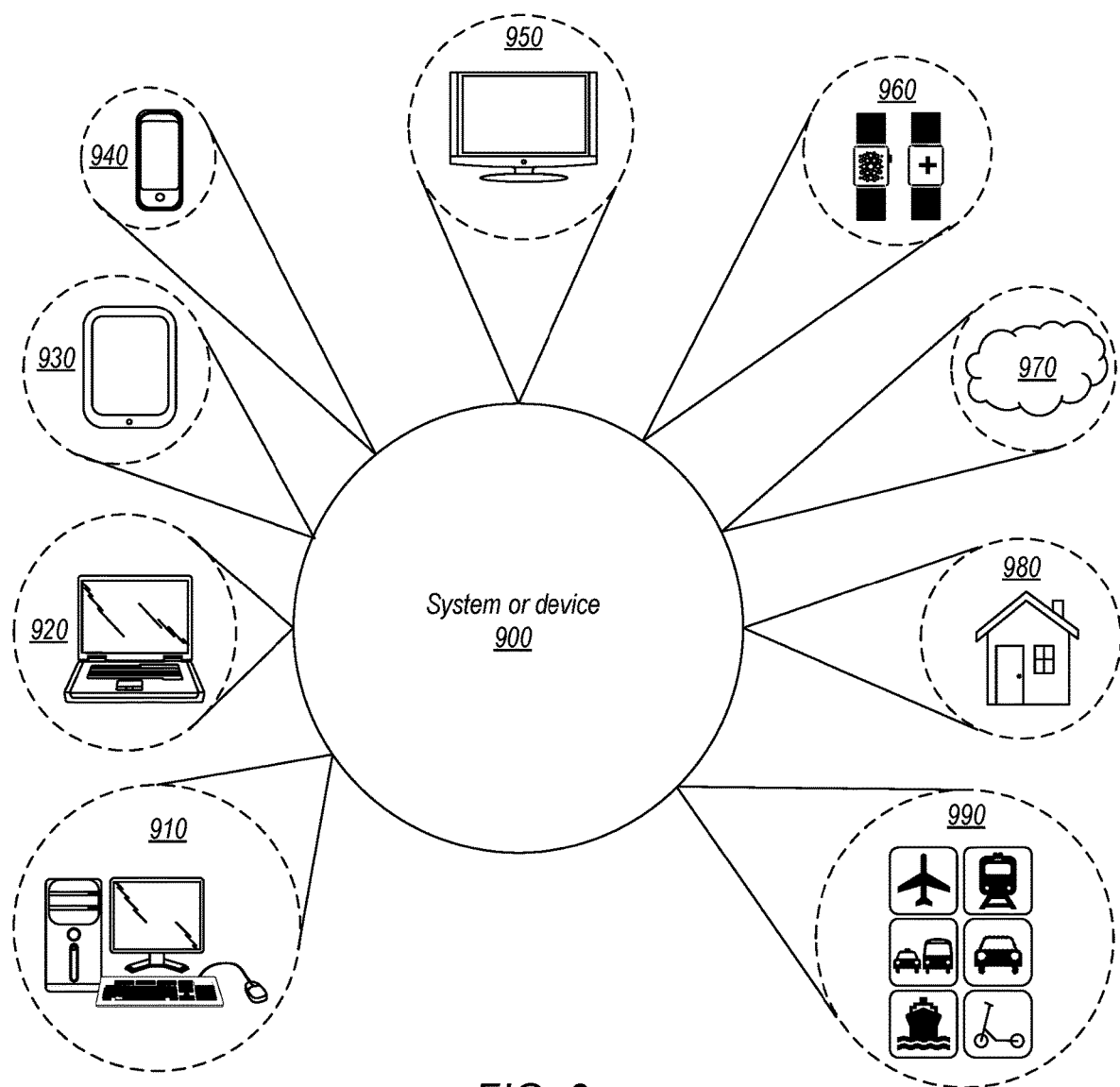
FIG. 9 is a block diagram of various embodiments of computer systems that may include receiver circuits.

Turning now to FIG. 9, various types of systems that may include any of the circuits, devices, or systems discussed above are illustrated. System or device 900, which may incorporate or otherwise utilize one or more of the techniques described herein, may be utilized in a wide range of areas. For example, system or device 900 may be utilized as part of the hardware of systems such as a desktop computer 910, laptop computer 920, tablet computer 930, cellular or mobile phone 940, or television 950 (or set-top box coupled to a television).

Similarly, disclosed elements may be utilized in a wearable device 960, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 900 may also be used in various other contexts. For example, system or device 900 may be utilized in the context of a server computer system, such as a dedicated server or on shared hardware that implements a cloud-based service 970. Still further, system or device 900 may be implemented in a wide range of specialized everyday devices, including devices 980 commonly found in the home such as refrigerators, thermostats, security cameras, etc. The interconnection of such devices is often referred to as the "Internet of Things" (IoT). Elements may also be implemented in various modes of transportation. For example, system or device 900 could be employed in the control systems, guidance systems, entertainment systems, etc. of various types of vehicles 990.

The applications illustrated in FIG. 9 are merely exemplary and are not intended to limit the potential future applications of disclosed systems or devices. Other example applications include, without limitation: portable gaming devices, music players, data storage devices, unmanned aerial vehicles, etc.

Figure 10:
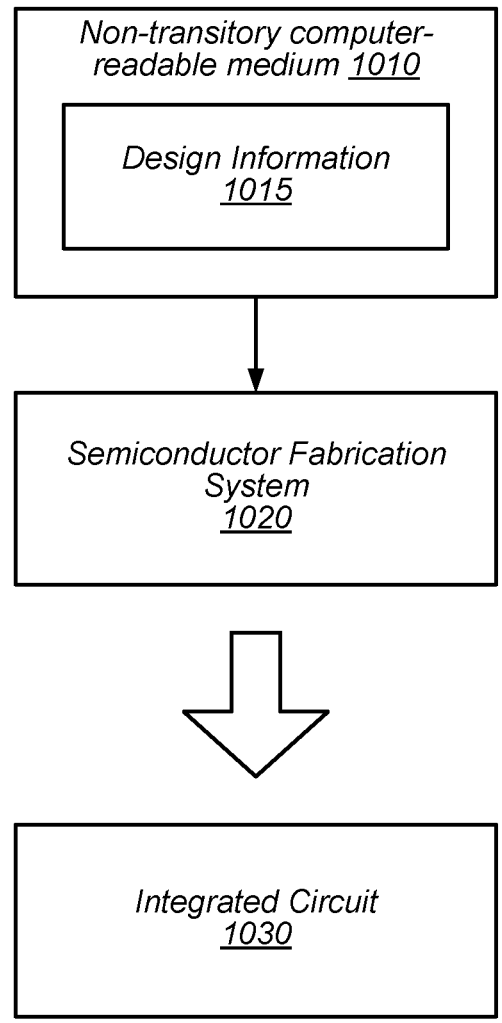
FIG. 10 illustrates an example of a non-transitory computer-readable storage medium that stores circuit design information.

FIG. 10 is a block diagram illustrating an example of a non-transitory computer-readable storage medium that stores circuit design information, according to some embodiments. In the illustrated embodiment, semiconductor fabrication system 1020 is configured to process the design information 1015 stored on non-transitory computer-readable storage medium 1010 and fabricate integrated circuit 1030 based on the design information 1015.

Non-transitory computer-readable storage medium 1010 may comprise any of various appropriate types of memory devices or storage devices. Non-transitory computer-readable storage medium 1010 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1010 may include other types of non-transitory memory as well or combinations thereof. Non-transitory computer-readable storage medium 1010 may include two or more memory mediums, which may reside in different locations, e.g., in different computer systems that are connected over a network.

Design information 1015 may be specified using any of various appropriate computer languages, including hardware description languages such as, without limitation: VHDL, Verilog, SystemC, SystemVerilog, RHDL, M, MyHDL, etc. Design information 1015 may be usable by semiconductor fabrication system 1020 to fabricate at least a portion of integrated circuit 1030. The format of design information 1015 may be recognized by at least one semiconductor fabrication system, such as semiconductor fabrication system 1020, for example. In some embodiments, design information 1415 may include a netlist that specifies elements of a cell library, as well as their connectivity. One or more cell libraries used during logic synthesis of circuits included in integrated circuit 1030 may also be included in design information 1015. Such cell libraries may include information indicative of device or transistor level netlists, mask design data, characterization data, and the like, of cells included in the cell library.

Integrated circuit 1030 may, in various embodiments, include one or more custom macrocells, such as memories, analog or mixed-signal circuits, and the like. In such cases, design information 1015 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1020 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1020 may also be configured to perform various testing of fabricated circuits for correct operation.

In various embodiments, integrated circuit 1030 is configured to operate according to a circuit design specified by design information 1015, which may include performing any of the functionality described herein. For example, integrated circuit 1030 may include any of various elements shown or described herein. Further, integrated circuit 1030 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
   a data detection circuit configured to detect transmitted data on a communications link, wherein, in detecting the transmitted data, the data detection circuit is configured to:
     perform a first comparison of a magnitude of at least one signal to a reference voltage, wherein the at least one signal encodes a serial data stream that includes a plurality of data symbols; and
     activate a signal present indicator using a result of the first comparison;

a speed detection circuit configured to, in response to an activation of the signal present indicator, determine if the communications link is operating in a high-speed mode or a low-speed mode, wherein, in response to detecting that a number of transitions in the serial data stream over a reference period of time exceeds a threshold value, generate a speed detection signal indicating operation in the high-speed mode; and a receiver circuit including a plurality of subcircuits, wherein the receiver circuit is configured to activate one or more of the plurality of subcircuits in response to an activation of the speed detection signal.

2. The apparatus of claim 1, wherein the receiver circuit is further configured to sample at least one signal to generate a plurality of samples, and wherein to generate the speed detection signal, the speed detection circuit is further configured to:

determine the number of transitions in the serial data stream over the reference period of time using the plurality of samples;

perform a second comparison of the number of transitions to the threshold value; and activate the speed detection signal using a result of the second comparison.

3. The apparatus of claim 2, wherein the speed detection circuit is further configured to filter the signal present indicator to generate an enable signal.

4. The apparatus of claim 2, wherein the speed detection circuit is further configured to adjust a value of the reference period of time using one or more operational characteristics of a computer system that includes the receiver circuit.

5. The apparatus of claim 2, wherein to sample the at least one signal, the receiver circuit is further configured to:

sample the at least one signal using a first edge of a clock signal to generate a first sample; and sample the at least one signal using a second edge of the clock signal to generate a second sample; and wherein to perform the second comparison, the speed detection circuit is further configured to compare the first sample to the second sample.

6. The apparatus of claim 1, wherein the data detection circuit is further configured to:

set the reference voltage to an initial value; and modify a value of the reference voltage in response to a determination that the magnitude of the at least one signal exceeds the initial value of the reference voltage.

7. A method, comprising:

receiving, by a detector circuit via a communication link, at least one signal that encodes a serial data stream that includes a plurality of data symbols;

performing, by the detector circuit, a first comparison of a magnitude of at least one signal of the one or more signals to a reference voltage;

generating, by the detector circuit, a signal present indicator, to indicate a presence of transmitted data on the communication link, using a result of the first comparison;

in response to activating the signal present indicator, sampling, by the detector circuit, the at least one signal to generate a plurality of samples;

determining, by the detector circuit, if the communication link is operating in a high-speed mode or a low-speed mode, wherein the determining comprises performing a second comparison, using the plurality of samples, of a number of transitions in the serial data stream during a reference period of time to a threshold value; and activating, in response to determining that the number of transitions exceeds the threshold value, one or more subcircuits of a plurality of subcircuits included in a receiver circuit coupled to the communication link.

8. The method of claim 7, wherein activating the one or more subcircuits includes:

performing the second comparison of the number of transitions to a threshold value;

generating an enable signal using a result of the second comparison; and activating the one or more subcircuits in response to activating the enable signal.

9. The method of claim 7, further comprising, determining a value of the reference period using one or more operational characteristics of a computer system that includes the detector circuit.

10. The method of claim 7, further comprising:

setting the reference voltage to an initial value; and modifying a value of the reference voltage in response to determining that the magnitude of the at least one signal exceeds the initial value of the reference voltage.

11. The method of claim 7, further comprising:

filtering, by the detector circuit, the signal present indicator to generate a filtered active signal; and sampling, by the detector circuit in response to determining that the filtered active signal has a particular value, the at least one signal to generate the plurality of samples.

12. The method of claim 7, wherein sampling, by the detector circuit, the at least one signal includes:

sampling the at least one signal using a first edge of a clock signal to generate a first sample; and sampling the at least one signal using a second edge of the clock signal to generate a second sample; and wherein determining the number of transitions includes comparing the first sample to the second sample.

13. The method of claim 7, further comprising, recovering, by the receiver circuit in response to activating the one or more subcircuits, one of more of the plurality of data symbols from the at least one signal.

14. An apparatus, comprising:

a first device configured to transmit at least one signal via a communication link, wherein the one or more signals encode a serial data stream that includes a plurality of data symbols; and a second device coupled to the communication link, wherein the second device includes a detector circuit configured to:

receive, via the communication link, the one or more signals;

detect a presence of the one or more signals, wherein in detecting the presence of the one or more signals, the detector circuit is configured to perform a first comparison of a magnitude of at least one signal of the one or more signals to a reference voltage;

generate a signal present indicator using a result of the first comparison in response to detecting the presence of the one or more signals;

in response to an activation of the signal present indicator, sample the at least one signal to generate a plurality of samples; and determine if the communication link is operating in high-speed mode a low-speed mode by performing a second comparison of a number of transitions in the serial data stream, during a reference period of time using the plurality of samples, to a threshold value; and wherein the second device further includes a receiver circuit including a plurality of subcircuits, and wherein the receiver circuit is configured to activate, in response to determining that the communication link is operating in the high-speed mode, one or more subcircuits of the plurality of subcircuits.

15. The apparatus of claim 14, wherein the detector circuit is further configured to:
   perform the second comparison of the number of transitions to the threshold value; and
   generate an enable signal using a result of the second comparison; and
   wherein the receiver circuit is further configured to activate the one or more subcircuits in response to an activation of the enable signal.

16. The apparatus of claim 14, wherein the detector circuit is further configured to determine a value of the reference period of time using one or more operational characteristics of a computer system that includes the first device and the second device.

17. The apparatus of claim 14, wherein the detector circuit is further configured to:
   set the reference voltage to an initial value; and
   modify a value of the reference voltage in response to a determination that the magnitude of the at least one signal exceeds the initial value of the reference voltage.

18. The apparatus of claim 14, wherein the detector circuit is further configured to:
   filter the signal present indicator to generate a filtered active signal; and
   sample, in response to a determination that the filtered active signal has a particular value, the at least one signal to generate the plurality of samples.

19. The apparatus of claim 14, wherein to sample the at least one signal, the detector circuit is further configured to:
   sample the at least one signal using a first edge of a clock signal to generate a first sample; and
   sample the at least one signal using a second edge of the clock signal to generate a second sample.

20. The apparatus of claim 19, wherein to determine the number of transitions, the detector circuit is further configured to includes comparing the first sample to the second sample.

* * * * *